United States Patent [19]

Huntington

[11] 4,071,830
[45] Jan. 31, 1978

[54] COMPLEMENTARY FIELD EFFECT TRANSISTOR LINEAR AMPLIFIER

[75] Inventor: Robert Charles Huntington, Phoenix, Ariz.

[73] Assignee: Motorola, Inc., Schaumburg, Ill.

[21] Appl. No.: 593,073

[22] Filed: July 3, 1975

[51] Int. Cl.$^2$ .............................................. H03F 3/16
[52] U.S. Cl. .................................... 330/277; 330/311; 330/290
[58] Field of Search .................... 307/304; 330/17, 18, 330/25, 35, 13

[56] References Cited

U.S. PATENT DOCUMENTS

| | | | |
|---|---|---|---|
| 3,286,189 | 11/1966 | Mitchell | 330/18 X |
| 3,913,026 | 10/1975 | Koehler | 307/304 X |
| 3,917,964 | 11/1975 | Carlson | 330/35 X |

Primary Examiner—Lawrence J. Dahl
Attorney, Agent, or Firm—Joe E. Barbee

[57] ABSTRACT

A linear voltage amplifier includes an input stage which has a P channel MOSFET load device and an N channel input device. The complementary amplifier also includes a feedback circuit which includes a low pass filter coupled between the output stage and the gate electrode of the P channel load device. The P type tub region in which the N channel input MOSFET is located is biased by an adjustable bias circuit to control threshold voltage of the input MOSFET and thereby control the DC level of the output of the complementary amplifier. In one embodiment the biasing circuit includes a P channel MOSFET coupled in series with a diode connected N channel MOSFET between two voltage supply conductors, the gate of the P channel MOSFET being connected to the gate of the P channel MOSFET load device of the input stage. The junction between the P channel MOSFET and the diode connected N channel MOSFET is coupled to one terminal of a high value resistor, the other end of which is connected to the input conductor which is connected to the gate of the N channel input MOSFET.

7 Claims, 3 Drawing Figures

000
COMPLEMENTARY FIELD EFFECT TRANSISTOR LINEAR AMPLIFIER

BACKGROUND OF THE INVENTION

1. Field of the Invention

The invention relates to complementary field effect transistor linear amplifiers.

2. Description of the Prior Art

Integrated circuit amplifiers utilizing bipolar integrated circuit technology are well know in the art. Such amplifiers commonly utilize feedback to improve gain and stability characteristics for various types of amplifier circuits. More recently, linear circuits have been implemented utilizing MOS and CMOS (complementary metal oxide semiconductor field effect transistor) technology. However, the MOS and CMOS technologies have been more often utilized to implement digital integrated circuits, where substantial cost-performance advantages have been realized where moderate speed performance was acceptable and very low power dissipation was required. However, bipolar transistor circuitry has an inherent speed performance advantage over MOS or CMOS circuitry due to the inherently greater gain characteristics of a bipolar transistor requiring an equivalent amount of silicon chip surface area. Linear circuit applications have often required the additional gain and power handling capability of bipolar transistor circuitry, so until recently MOS and CMOS circuits have found rather limited application in the area of linear circuits. Feedback has normally been utilized in linear amplifiers by utilizing some type of feedback circuit to couple a signal from an output stage to an input of the subject amplifier, the input normally being the same input to which an input signal is normally coupled. Adjustment of the DC (direct current) output level of amplifiers has often been accomplished by providing a DC bias to the input of the amplifier, to which an AC signal is capacitively coupled, or by adjusting resistors and emitter bipass circuits of the input stage or intermediate stages of the amplifier.

A basic problem in cascading three or more direct coupled self biased CMOS linear amplifier stages is that any deviation from ideal self-bias conditions is amplified with the result that the output stage is driven toward either the positive or negative supply voltage levels.

In the context, the ideal condition referred to consists of the common drain voltage in a self-biased CMOS inverter stage equalling exactly one half the supply voltage. However, this is normally difficult to accomplish unless individual matched discrete devices are utilized. In the CMOS technology, the P channel and N channel MOSFETs have different gains and different threshold voltages, typically. Further, matching of similar devices on the same silicon chip for MOS and CMOS technologies is not nearly as close as similar matching of $V_{BE}$ voltages in bipolar linear integrated circuit technology. (In general, CMOS linear amplifiers of the prior art which provide reasonably high gain, and are direct coupled so as to provide both AC and DC gain over a reasonable bandwidth have been difficult to manufacture).

SUMMARY OF THE INVENTION

It is an object of this invention to provide an amplifier utilizing field effect transistors and having feedback from an output stage of the amplifier to a load field effect transistor of the input stage.

Another object of the invention is to provide a direct coupled field effect transistor linear amplifier having a bias circuit which biases the tub in which an input transistor is located to adjust the DC offset voltage of the amplifier.

Briefly described, the invention is a complementary field effect transistor amplifier including an output circuit and an input circuit, the input circuit having a field effect transistor load device and a field effect transistor input device coupled in series. A feedback circuit is coupled between the output stage and a gate electrode of the field effect transistor and load device for biasing it to cause a controlled, stable output voltage to be produced by the output circuit. The feedback circuit includes a low pass filter which prevents incremental excursions of the output signal from substantially affecting the current produced by the field effect transistor load device. In one embodiment, a Miller effect capacitance multiplier circuit is utilized in the low pass filter. In another embodiment a tub region wherein said field effect transistor input device is located is biased by a bias circuit to adjust the DC output level or DC offset voltage of the complementary field effect transistor amplifier. In another embodiment a self-biasing input network is provided to provide a DC bias voltage for the gate of the field effect transistor input device.

DESCRIPTION OF THE INVENTION

Figure 1:
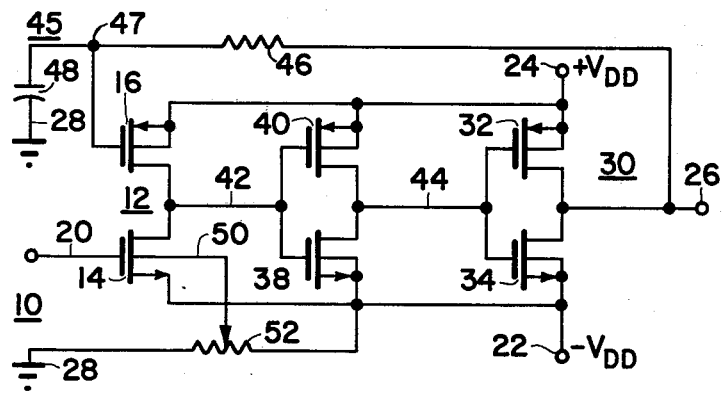
FIG. 1 is a schematic diagram of one embodiment of the invention.

One embodiment of the invention, shown in the circuit schematic of FIG. 1, is a linear amplifier 10 which includes an input circuit stage 12 having a P channel load MOSFET 16 having its source connected $V_{DD}$ voltage conductor 24 and its drain connected to node 42, which is the output of input circuit stage 12, and its gate connected to node 47. Input circuit stage 12 also includes N channel MOSFET 14, which has its source connected to $-V_{DD}$ voltage conductor 22, its drain connected to node 42, and its gate connected to input node 20. In the present state of the art, integrated circuits including both P channel and N channel MOSFETs are referred to as CMOS or CMOSFET (complementary metal oxide semiconductor field effect transistor) integrated circuits. Conventionally, the P type source and drain regions of the P channel devices are fabricated in an N type substrate. The N channel MOSFETs are conventionally formed by having their N type source and drain regions diffused into a lightly doped P type tub region which is itself diffused into the N type substrate. For a more complete discussion of MOSFET device operation and physics see "Physics and Technology of Semiconductor Devices" by A. S. Grove, Wiley & Sons, Inc., New York, 1967. Also see U.S. Pat. Nos. 3,667,009; 3,759,763; and 3,806,371 for a discussion of CMOS integrated circuit structures.

Linear CMOS amplifier 10 also includes an intermediate stage 36 which includes P channel MOSFET 40 and N channel MOSFET 38 coupled in series between $+V_{DD}$ and $-V_{DD}$ to form a conventional CMOS inverter having its input connected to node 42 and its output connected to node 44.

Linear CMOS circuit 10 also includes an output stage 30 including P channel MOSFET 32 and N channel MOSFET 34 connected between $+V_{DD}$ and $-V_{DD}$ to form another CMOS inverter having its input connected to node 44 and its output connected to output conductor 26. A low pass filter feedback circuit 45 includes impedance means 46 coupled between output conductor 26 and node 47. In a preferred embodiment impedance means 46 is a resistor which may be, for example, polycrystalline silicon in a silicon gate embodiment of the invention, and may have a value of approximately 100 megohms. Feedback circuit 45 also includes capacitor 48 connected between node 47 and ground conductor 28. Capacitor 48 may, however, be coupled to any other supply voltage conductor in lieu of ground conductor 28. The combination of resistor 46 and capacitor 48 provides a low pass filter, if capacitor 48 is sufficiently large in capacitance and the resistance of resistor 46 is sufficiently large. Then high frequency variations of voltage on output conductor 26 are filtered out and only the average DC value of the voltage on output conductor 26 is applied to the gate of load MOSFET 16. This voltage forces MOSFET 16 to provide a substantially constant drain current which is conducted through the drain to source of MOSFET 14. The effect of a signal voltage applied to terminal 20 is to modulate the channel conductance of MOSFET 14 such that an amplified signal voltage is produced at mode 42.

The fourth terminal of input MOSFET 14 is, in an integrated circuit embodiment, the tub region in which N channel MOSFET 14 is fabricated, and is biased at a voltage adjusted to produce the desired DC offset between the voltage on output conductor 26 and the voltage on input conductor 20. Varying the voltage of P type tub 50 effectively modifies the MOS threshold voltage $V_{T0}$ of input transistor 14, as explained in the above mentioned Grove reference. Bias voltage applied to P type tub 50 is accomplished by circuit 51, which in the embodiment of FIG. 1 is a resistive voltage divider 52 coupled between $-V_{DD}$ and ground. However, any type of suitable circuit, internal to or external to the integrated circuit chip of CMOS linear circuit 10, may be utilized to provide the bias voltage of P tub 50.

Figure 2:
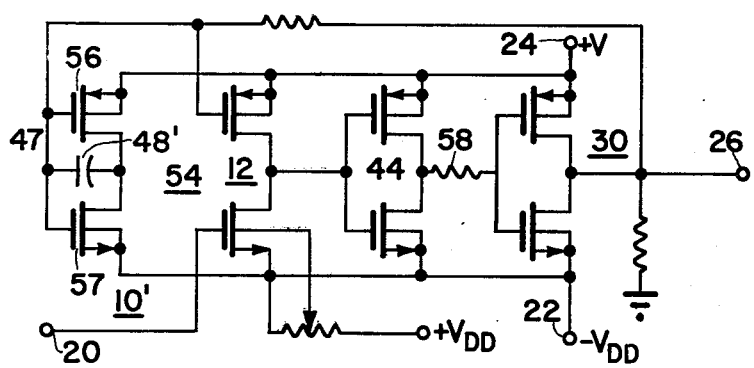
FIG. 2 is a schematic diagram of another embodiment of the invention.

Referring to FIG. 2, it is seen that the linear amplifier 10' is different from the embodiment of FIG. 1 only by the addition of capacitance multiplier circuit 54, which includes a capacitor 48' coupled between the input and output of a CMOS amplifier including P channel MOSFET 56 and N channel MOSFET 57 coupled in series between $+V_{DD}$ and $-V_{DD}$ and having it input connected to node 47. Those skilled in the art will recognize that the well known Miller effect principle applies to capacitance multiplier circuit 54, wherein the gain of the inverter formed by MOSFET 56 and 57 is multiplied by the capacitance of capacitor 48' to produce the effective capacitance between node 47 and $-V_{DD}$ conductor 22. Thus, it is seen that in an integrated circuit embodiment of the invention, a much smaller value of capacitance 48' is required to achieve a low pass filter for feedback circuit 45' of FIG. 2 than for feedback circuit 45 of FIG. 1. This can provide a tremendous advantage in an integrated circuit implementation of a CMOS linear amplifier according to the invention, since far less chip will be required for circuit 54 than for capacitor 48 of FIG. 1. Further, the utilization of circuit 54 may make the difference between having the capacitor on the integrated circuit chip and requiring an external connection for the semiconductor package and requiring the use of an external capacitor for capacitor 48. CMOS linear amplifier 10' of FIG. 2 further includes resistor 58 coupled between node 44 and the input of output stage 30. This resistor may have a value of the order of 100 kilohms to 10 or more megohms and may be used to dampen instabilities which might occur due to spurious feedback in a practical embodiment of the amplifier.

Figure 3:
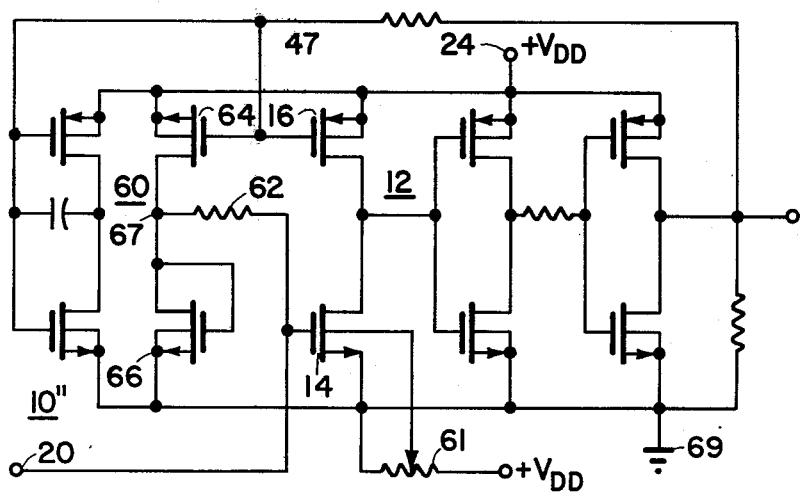
FIG. 3 is a schematic diagram of another embodiment of the invention.

The embodiment of FIG. 3 is similar to the embodiment of FIG. 2, except that input biasing circuit 60 has been added. Input biasing circuit 60 includes P channel MOSFET 64 coupled between $+V_{DD}$ conductor 24 and node 67 having its gate connected to node 47 and its drain connected to node 67. Self-biased, or diode connected N channel MOSFET 66 has its source connected to ground conductor 69 and its gate and drain connected to node 67. Resistor 62, which may have a resistance on the order of 10 megohms is connected between node 67 and input conductor 20. This embodiment operates effectively utilizing only a single supply voltage $+V_{DD}$, and provides adjustable biasing of the DC output voltage of the linear amplifier 10" by means of P tub biasing circuit 61 and input biasing circuit 60. Provisions of feedback from the output of linear amplifier 10" to the gate of MOSFET 64 provides the same tracking of the input bias point as is provided for MOSFET 16.

The three stage CMOS direct coupled linear amplifier configurations of FIGS. 1, 2, and 3 exploit the unique linear circuit characteristics of CMOS inverter circuit stages to provide, without device selection, controlled bias on each stage. The RC network forming feedback circuit 45 constitutes a low pass structure which filters the signal frequency from the feedback to the gate of load MOSFET 16. This allows the capacitor 48 or the capacitance multiplier circuit 54 to charge the gate of load MOSFET 16 to the average DC level of the output voltage on output conductor 26. MOSFET 16 thus acts a voltage controlled current generator which is controlled by the voltage on capacitor 48 (or capacitance multiplier circuit 54). The input signal applied to input conductor 20 may be coupled directly to the gate of input transistor 14 if the signal source correctly biases the gate, for example, by having a resistive internal impedance to ground. If capacitive coupling of the input signal applied to the input conductor 20 is used, MOSFET 14 may, for example, be self biased by the addition of a resistor from its gate to its drain. As the gate-to-source $V_{GS}$ from MOSFET 14 is driven by the applied input signal, the drain-to-source voltage $V_{DS}$ varies in such a manner as to maintain the drain current constant at the value fixed by MOSFET 16, which acts a voltage controlled current generator.

A typical value which may be used for capacitor 48 of FIG. 1 is 1000 picofarads. However, using reasonable width-to-length geometries from MOSFETs 56 and 57 in FIG. 2, the same filtering results can be accomplished by utilizing capacitor 48' with a value of only 20 picofarads.

Input impedance of the circuit of FIG. 2 is essentially infinite at frequencies within its path band, and output impedance of only a few ohms is rarely achievable in an integrated circuit implementation. It should be noted that this amplifier may become unstable with certain configurations of internal input and feedback impedance, as is the case with all high gain active networks. Referring to FIG. 2, the output resistor coupled between ground and output node 26 and resistor 58 may be effectively used in stabilizing the amplifier in the presence of most combinations of external impedance.

Applications of the circuit configuration according to the invention include its utilization as a high gain amplifier for active filters, ramp generators, or integrators such as may be used in analog to digital or digital to analog converters, as summing amplifiers, as broad band constant gain audio amplifiers, or as a single input operational amplifier. These circuit functions can be realized by the addition of appropriate input networks to node 20 and feedback networks between nodes 26 and 20. As an example, any one of the circuits of FIGS. 1, 2, or 3 becomes an integrator or ramp generator by applying the input signal through a series resistor $R_i$ connected to node 20 with a feedback capacitor $C_i$ connected between nodes 26 and 20. The integrator time constant thus is $R_iC_i$.

The invention provides several improvements over the prior art in providing a CMOS linear amplifier having stable DC bias control capability and high gain for both DC and AC applications, further its DC offset voltage is readily adjustable. Further, it is tolerant of a wide range of variation of device parameters, such as MOSFET threshold voltage, mobility, etc. Precision operation is provided without the necessity that all devices in the amplifier be carefully matched with respect to threshold voltage or other intrinsic parameters.

What is claimed is:

1. A complementary field effect transistor amplifier including an output circuit and an input circuit having a field effect transistor load device and a field effect transistor input device coupled in series comprising feedback circuit means coupled between said output stage and a gate electrode of said field effect transistor load device for biasing said field effect transistor load device to cause a controlled output voltage to be produced by said output circuit, wherein said feedback circuit means includes a low pass filter which acts to feedback an output signal produced at an output of said output stage to said field effect transistor load device for preventing incremental excursions of said output signal from substantially affecting the current produced by said field effect transistor load device.

2. The complementary field effect transistor amplifier as recited in claim 1 including at least one intermediate amplification circuit stage coupled between said input circuit and said output circuit.

3. The complementary field effect transistor amplifier as recited in claim 2 wherein said feedback circuit means includes resistive circuit means coupled between an output of said output stage and said gate electrode of said field effect transistor load device.

4. The complementary field effect transistor amplifier as recited in claim 3 wherein said feedback means further includes capacitance means coupled to said gate of said field effect transistor load device for acting as a low pass filter in cooperation with said resistive means.

5. The complementary field effect transistor amplifier as recited in claim 4 further including a complementary transistor inverter having a capacitor coupled between an input and an output thereof, and having its input coupled to said gate of said field effect transistor load device.

6. The complementary field effect transistor amplifier as recited in claim 1 wherein said field effect transistor input device is located in a tub region and further comprising bias circuit means coupled to said tub region for biasing said tub region at a suitable voltage for adjusting the input threshold voltage of said field effect input transistor.

7. The complementary field effect transistor amplifier as recited in claim 6 wherein said bias circuit means is externally adjustable for permitting adjustment of a DC output level of said complementary field effect transistor amplifier.

* * * * *